United States Patent
Chen

(10) Patent No.: US 10,862,468 B1
(45) Date of Patent: Dec. 8, 2020

(54) DELAY CIRCUIT

(71) Applicant: REALTEK SEMICONDUCTOR CORP., Hsinchu (TW)

(72) Inventor: Chien-Wen Chen, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 16/808,579

(22) Filed: Mar. 4, 2020

(30) Foreign Application Priority Data

Jun. 13, 2019 (TW) .............................. 108120438 A

(51) Int. Cl.
*H03K 5/134* (2014.01)
*G05F 3/24* (2006.01)
*G05F 3/22* (2006.01)

(52) U.S. Cl.
CPC ............ *H03K 5/134* (2014.07); *G05F 3/222* (2013.01); *G05F 3/242* (2013.01)

(58) Field of Classification Search
CPC ......... H03K 5/134; G05F 1/462; G05F 1/463; G05F 3/222; G05F 3/242
See application file for complete search history.

(56) References Cited

U.S. PATENT DOCUMENTS 5,910,744 A * 6/1999 Watarai .................. H03K 5/133 327/133
6,686,792 B2 * 2/2004 Nakamiya .............. G04G 19/00 327/378

OTHER PUBLICATIONS

Goran S. Jovanović; Mile K. Stojčev. "Linear Current Starved Delay Element."

* cited by examiner

*Primary Examiner* — Jung Kim
(74) *Attorney, Agent, or Firm* — Li & Cai Intellectual Property (USA) Office

(57) ABSTRACT

A delay circuit includes an inverting receiving circuit, a reference point generating circuit, a first buffer gate and a first inverter. An inverting receiving circuit includes a first transistor and a first switching circuit. The reference point generating circuit includes a compensation resistor, a capacitor element, and a first current source. In response to the input signal being at a first potential, a voltage of the output node starts to decrease from a voltage reference point. In response to at least one of a manufacturing process, the first reference voltage, and a temperature being changed, the compensation resistor is configured to correct the voltage reference point.

12 Claims, 3 Drawing Sheets

DELAY CIRCUIT

CROSS-REFERENCE TO RELATED PATENT APPLICATION

This application claims the benefit of priority to Taiwan Patent Application No. 108120438, filed on Jun. 13, 2019. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a delay circuit, and more particularly to a delay circuit that is not affected by process, voltage supplied, or temperature, and has an accurate delay time.

BACKGROUND OF THE DISCLOSURE

As is commonly known, operating characteristics of a transistor will change along with the temperature; and an operating speed thereof is slower under a high temperature and faster under low temperature. Therefore, a delay time of a delay circuit will change with temperature, which is not a good phenomenon.

Similarly, the operating speed of the transistor varies according to a process or a voltage supplied thereof. In other words, times that the voltage rises and falls, threshold voltages, and currents at internal nodes of the transistor will change according to changes in the process, the voltage supplied, and the temperature (PVT). Therefore, output signals will be different under different PVT conditions.

Since performances under different PVT conditions are significantly different, in order to alleviate difficulties in front-end circuit design, it is necessary to ensure that the performances are within a certain range in early stages of IC design. For example, changes in doping concentration may result in changes in performance, and these process variations increase as processing technology expands to smaller geometries. Process corners are used to classify the process variations. A naming convention for process corners uses a two-letter designator, where a first letter represents an N-channel MOSFET (NMOS) corner, and a second letter represents a P-channel MOSFET (PMOS) corner. In this naming convention, there are three corners, namely a typical (T) corner, a fast (F) corner, and a slow (S) corner. The fast corner and the slow corner exhibit higher and lower carrier mobility than normal, respectively.

In view of the disadvantages of the delay circuit described above, the present disclosure discloses a delay circuit that is not affected by the process, the voltage supplied, and the temperature and has a fixed delay time, which can address the above various disadvantages.

SUMMARY OF THE DISCLOSURE

In response to the above-referenced technical inadequacies, the present disclosure provides a delay circuit that allows an output signal to be unaffected by a process, a voltage supplied, and a temperature, and has a fixed delay time relative to the input signal by utilizing a design of a compensation resistor.

In one aspect, the present disclosure provides a delay circuit including an inverting receiving circuit, a reference point generating circuit, a first buffer gate, and a first inverter. The inverting receiving circuit includes a first transistor and a first switching circuit. The first transistor has a first terminal connected to a first node, a second terminal receiving an input signal, and a third terminal connected to an output node. The first switching circuit has a first terminal connected to the output node, a second terminal receiving the input signal, and a third terminal connected to the second reference voltage. The reference point generating circuit includes a compensation resistor, a capacitor element, and a first current source. The compensation resistor is connected between the first node and a first reference voltage. The capacitor element is connected between the first node and the second terminal of the first transistor. The first current source is connected between the first node and a second reference voltage. An input terminal of the first buffer gate is connected to the output node, and the first inverter has an input terminal connected to an output terminal of the first buffer gate, and an output terminal configured to output an output signal delayed by a delay time. In response to the input signal being at a first potential, the first transistor is turned off, the first switching circuit is turned on, and a voltage of the output node starts to decrease from a voltage reference point. In response to at least one of a manufacturing process, the first reference voltage, and temperature being changed, the compensation resistor is configured to correct the voltage reference point.

Therefore, the present disclosure provides a delay circuit that allows an output signal to be unaffected by a process, a voltage supplied, and a temperature, and has a fixed delay time relative to the input signal by utilizing a design of a compensation resistor.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
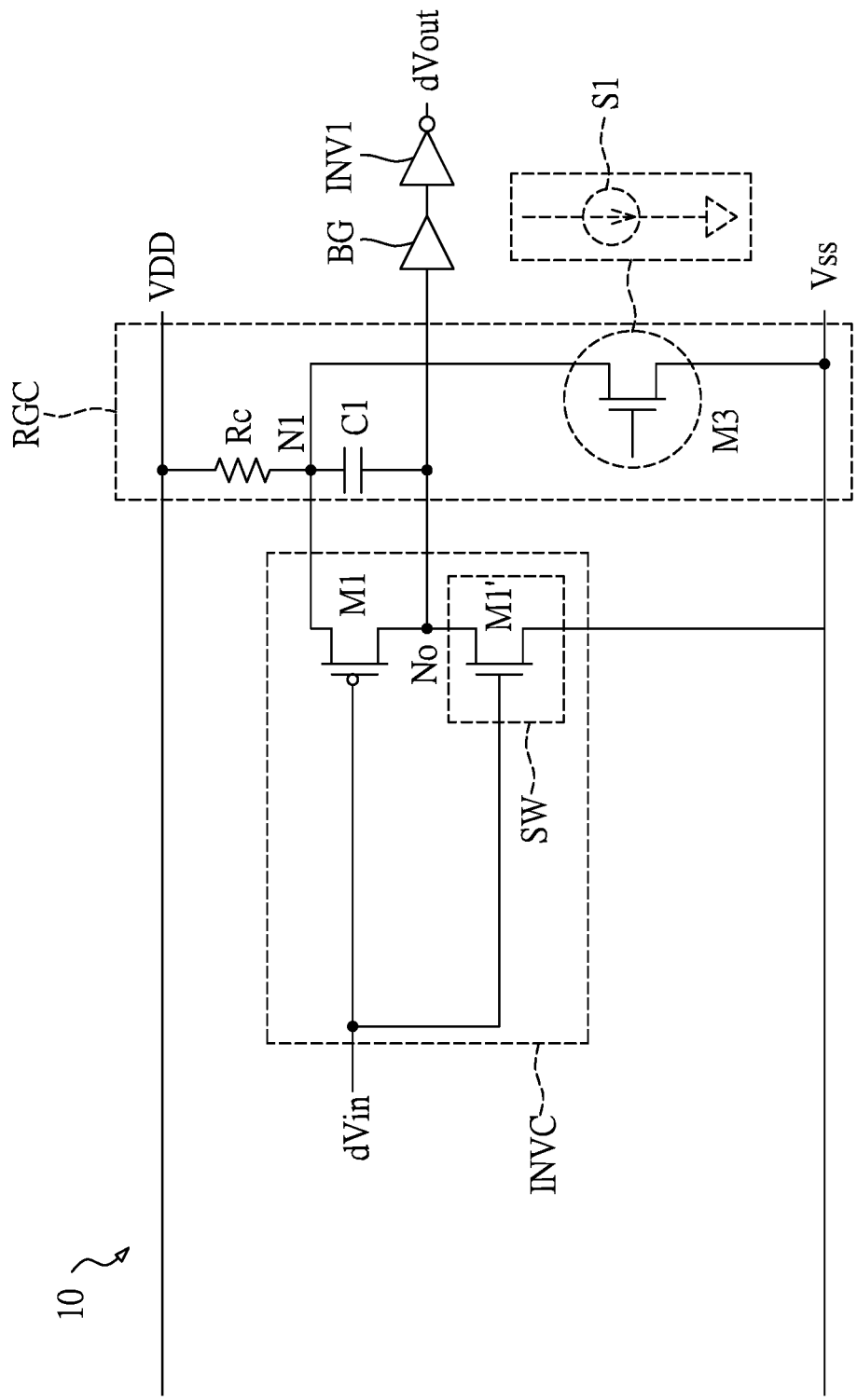
FIG. 1 is a circuit diagram of a delay circuit according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Reference is made to FIG. 1, which is a block diagram of a delay circuit according to an embodiment of the present disclosure. As shown in FIG. 1, an embodiment of the present disclosure provides a delay circuit 10 including an inverting receiving circuit INVC, a reference point generating circuit RGC, a first buffer gate BG, and a first inverter INV1.

The inverting receiving circuit INVC includes a first transistor M1 and a first switching circuit SW. The first transistor M1 has a first terminal connected to a first node N1, a second terminal receiving an input signal dVin, and a third terminal connected to an output node No. In some embodiments, the first transistor M1 may be a P-type metal oxide semiconductor (MOS) field effect transistor, and the first terminal, the second terminal, and the third terminal thereof may be a source, a gate, and a drain, respectively.

Next, a first terminal of the first switch circuit SW is connected to the output node No, a second terminal of the first switch circuit SW receives the input signal dVin, and a third terminal of the first switch circuit SW is connected to a second reference voltage Vss. In the present embodiment, the first switch circuit SW may include an N-type metal oxide semiconductor (MOS) field effect transistor M1', and the first terminal, the second terminal, and the third terminal of the first switch circuit SW may be a drain, a gate, and a source of the NMOS transistor M1', respectively.

Further, the reference point generating circuit RGC includes a compensation resistor Rc, a capacitor element C1, and a first current source S1.

The compensation resistor Rc is connected between the first node N1 and a first reference voltage VDD. The capacitor element C1 is connected between the first node N1 and the second terminal of the first transistor M1. The first current source S1 is connected between the first node N1 and a second reference voltage Vss. In the present embodiment, the first current source S1 may be a third transistor M3 having a first terminal connected to the first node N1 and a third terminal connected to the second reference voltage Vss, which can be equivalent to a first current source S1 that can control a magnitude of the current.

Figure 3:
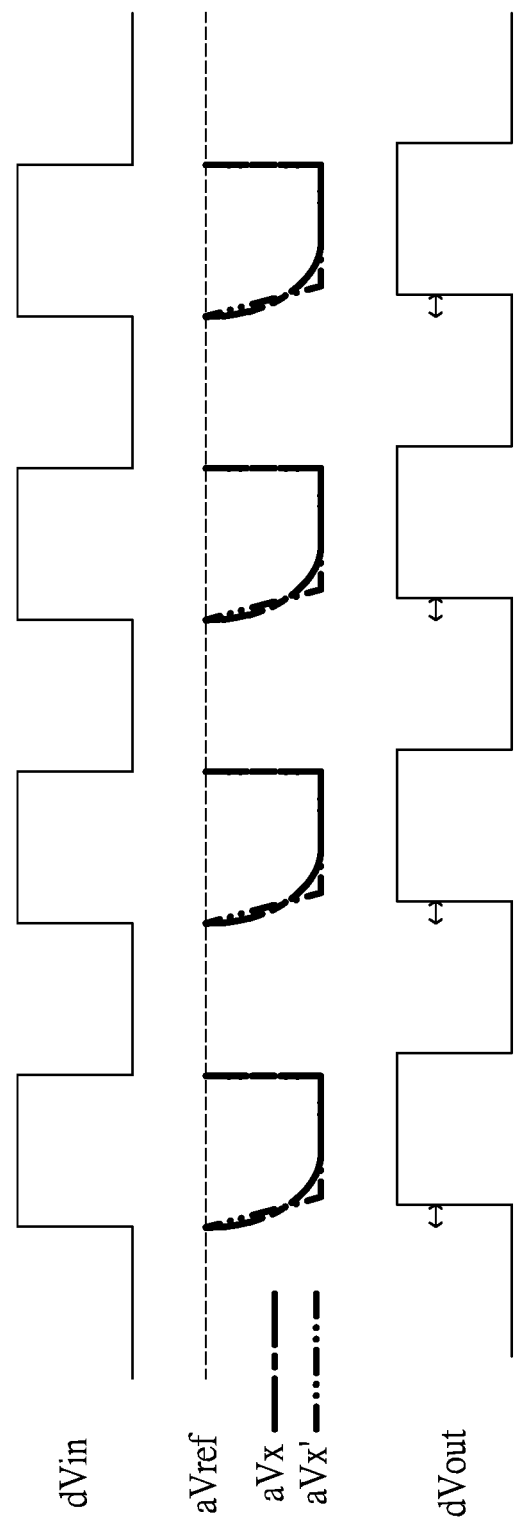
FIG. 3 is a voltage waveform diagram of an input signal, an output node voltage, and an output signal according to an embodiment of the present disclosure.

Reference is further made to FIG. 3, which is a voltage waveform diagram of an input signal, an output node voltage, and an output signal according to an embodiment of the present disclosure. As shown in FIG. 3, when the input signal dVin is at a first potential, such as a high potential, the first transistor M1 is turned off, the NMOS transistor M1' of the first switch circuit SW is turned on, and a voltage aVx of the output node No starts to fall from a voltage reference point aVref.

Further, when the input signal dVin is at a second potential, such as a low potential, the first transistor M1 is turned on, and the NMOS transistor M1' of the first switching circuit SW is turned off, such that the voltage aVx of the output node No returns to the voltage reference point aVref and charges the capacitor element C1.

In addition, an input terminal of the first buffer gate BG is connected to the output node No, and an input terminal of the first inverter INV1 is connected to an output terminal of the first buffer gate BG, and an output terminal of the first inverter INV1 is configured to output an output signal dVout delayed by a delay time. In this case, the first buffer gate BG is connected to the output node No to generate a pre-output signal in response to a change in the voltage aVx of the output node No. For example, when the voltage aVx of the output node No is higher than a threshold voltage of the first buffer gate BG, the pre-output signal will be enabled (high logic level); and since a trend of the changes of the voltage aVx of the output node No and the input signal dVin are inverted with each other, the first inverter INV1 is further provided to output the output signal dVout which is in phase with the input signal dVin.

Here, it should be noted that a level of the voltage reference point aVref depends on a voltage of the first reference voltage VDD and a resistance value of the compensation resistor Rc. The resistance value of the compensation resistor Rc depends more on process conditions adopted during a process for fabricating the delay circuit 10 and an operating temperature during the process. Therefore, when at least one of the process, the first reference voltage, and the temperature changes, the compensation resistor Rc can be used to correct the voltage reference point aVref. This voltage reference point aVref can follow the changes of PVT, thereby enabling the delay circuit 10 to generate a delay time being independent of PVT.

Furthermore, the third transistor M3 is provided to offset PVT effect with the compensation resistor Rc to generate the voltage reference point aVref, thereby further accurately controlling the delay time of the output signal dVout.

Figure 2:
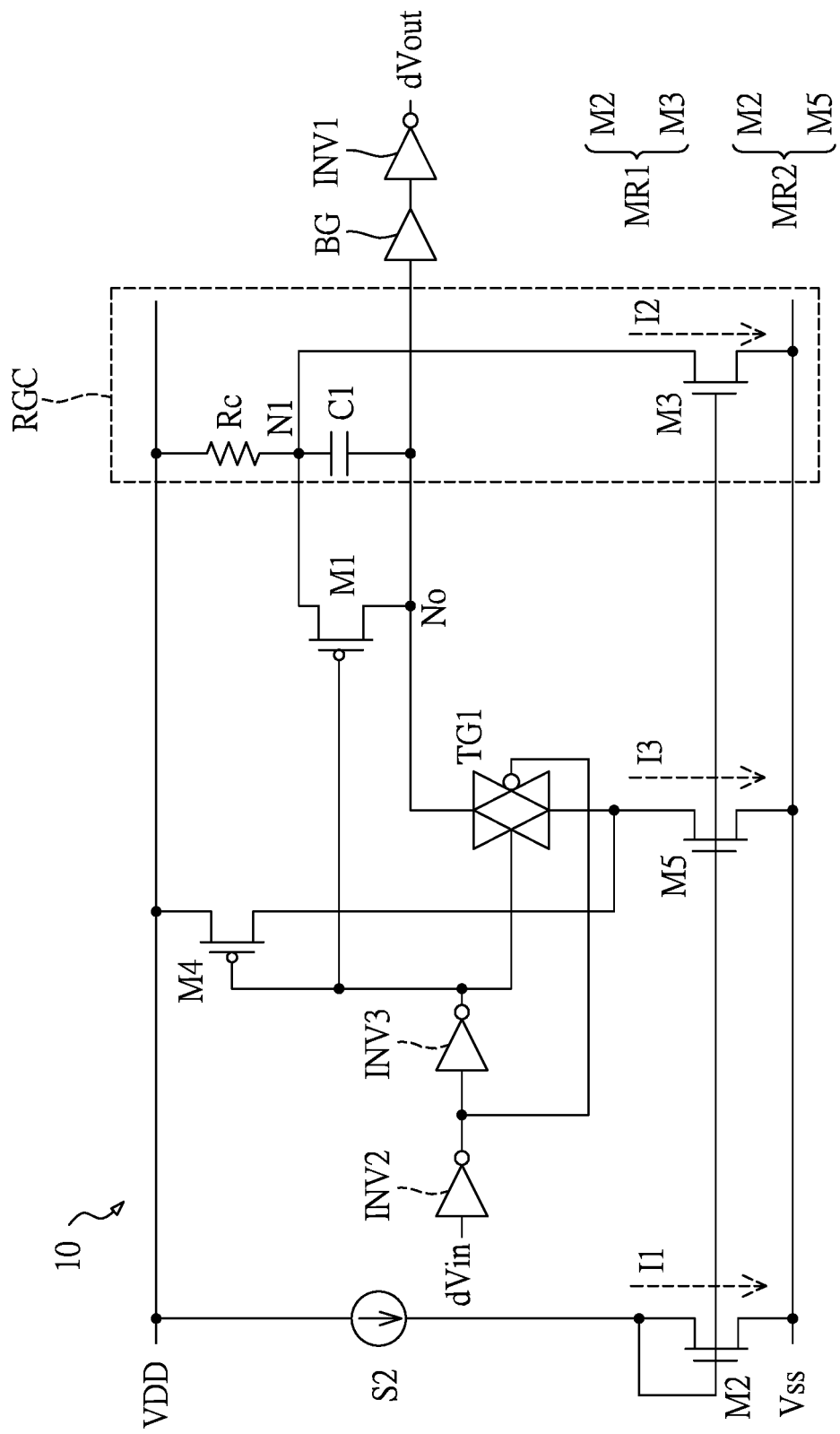
FIG. 2 is another circuit diagram of a delay circuit according to an embodiment of the present disclosure.

In addition to the above embodiments, reference is further made to FIG. 2, which is another circuit diagram of a delay circuit according to an embodiment of the present disclosure.

As shown in FIG. 2, the delay circuit 10 further includes a second current source S2 and a second transistor M2. The second current source S2 is connected between the first reference voltage VDD and the second reference voltage Vss, and the second transistor M2 is further connected between the second current source S2 and the second reference voltage Vss. A first end of the second transistor M2 is connected to the second current source S2, a second end of the second transistor M2 is connected to the first end thereof, and a third end of the second transistor M2 is connected to the second reference voltage Vss. In addition, in the present embodiment, the first current source S1 includes a third transistor M3 having a first terminal connected to the first node N1, a second terminal connected to the second terminal of the second transistor M2, and a third terminal connected to the second reference voltage Vss. Here, the second transistor M2 and the third transistor M3 form a first current mirror circuit MR1. Therefore, the current I1 generated at the second transistor M2 will be mirrored to the third transistor M3 to generate the same current I2. Preferably, the second transistor M2 and the third transistor M3 may be N-type MOS transistors.

As shown in FIG. 2, the delay circuit 10 further includes a second inverter INV2 and a third inverter INV3. An input terminal of the second inverter INV2 receives an input signal dVin, an input terminal of the third inverter INV3 is connected to the second inverter INV2, and an output terminal of the third inverter INV3 is connected to the second terminal of the first transistor M1.

Here, the second inverter INV2 and the third inverter INV3 can be used as a buffer gate to enhance the input signal dVin or to shape a waveform of the input signal dVin, and an inverted signal of the input signal dVin can be used to control the first switching circuit SW. Therefore, the inverted signal is output and supplied to the first switching circuit SW through the second inverter INV2, an output signal of the second inverter INV2 is then restored to the original signal by the third inverter INV3, and the original input signal dVin can be generated, while shaping and balancing the delay of the original input signal dVin.

Further, as shown in FIG. 2, the delay circuit 10 further includes a fourth transistor M4. The fourth transistor M4 has a first terminal connected to the first reference voltage VDD, and a second terminal connected to the second terminal of the first transistor M1 and the output terminal of the third inverter INV3.

In addition, the first switching circuit includes a transmission gate TG and a fifth transistor M5. The transmission gate TG has a first terminal connected to the output node No, a second terminal connected to a third terminal of the fourth transistor M4, a first control terminal connected to the output terminal of the third inverter INV3, and a second control terminal connected to an output terminal of the second inverter INV2. The fifth transistor M5 has a first terminal connected to the second terminal of the transmission gate TG and the third terminal of the fourth transistor M4, a second terminal connected to the second terminal of the second transistor M2, and a third terminal connected to the second reference voltage Vss. Preferably, the fifth transistor M5 may be an N-type MOS transistor.

Here, the first control terminal of the transmission gate TG equivalently receives the input signal dVin, and the second control terminal of the transmission gate TG equivalently receives an inverted signal of the input signal dVin. Therefore, when the input signal dVin is at a first potential, such as a high potential, a conduction path will be formed between the output node No and the fifth transistor M5. When the input signal dVin is at a second potential, such as a low potential, the transmission gate TG is turned off.

Since the fourth transistor M4 is a P-type MOS transistor, the fourth transistor M4 is turned off when the input signal dVin is at the high potential, and the fourth transistor M4 is turned on when the input signal dVin is at the low potential.

Here, the second transistor M2 and the fifth transistor M5 form a second current mirror circuit MR2. Reference is further made to FIG. 3, which is a voltage waveform diagram of an input signal, an output node voltage, and an output signal according to an embodiment of the present disclosure. As shown in FIG. 3, when the input signal dVin is at a first potential, such as a high potential, the first transistor M1 is turned off, and the transmission gate TG of the first switch circuit SW is turned on, thereby forming a conduction path between the output node No and the fifth transistor M5. At this time, the voltage aVx' of the output node No starts to decrease from the voltage reference point aVref. As can be seen from FIG. 3, the voltage aVx' of the output node No can be changed more linearly by providing the second current source S2, and controlling the second current source S2 to mirror and generate a current I3 at the fifth transistor M5, so as to accurately control a level of the voltage aVx' relative to the threshold voltage of the first buffer gate BG, such that the delay time of the output signal dVout can further be precisely controlled, accordingly.

Therefore, the present disclosure provides a delay circuit that allows an output signal to be unaffected by a process, a voltage supplied, and a temperature, and has a fixed delay time relative to the input signal by utilizing a design of a compensation resistor.

Furthermore, the voltage of the output node can be changed more linearly by providing the second current source and controlling the second current source to generate a mirror current, so as to accurately control a level of the output voltage relative to the threshold voltage of the first buffer gate, such that the delay time of the output signal can further be precisely controlled, accordingly.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:
1. A delay circuit, comprising:
an inverting receiving circuit, including:
    a first transistor having a first terminal connected to a first node, a second terminal receiving an input signal, and a third terminal connected to an output node; and
    a first switching circuit having a first terminal connected to the output node, a second terminal receiving the input signal, and a third terminal connected to a second reference voltage;
a reference point generating circuit, including:
    a compensation resistor connected between the first node and a first reference voltage;
    a capacitor element connected between the first node and the second terminal of the first transistor; and
    a first current source connected between the first node and the second reference voltage;
a first buffer gate having an input terminal connected to the output node; and
a first inverter having an input terminal connected to an output terminal of the first buffer gate, and an output terminal configured to output an output signal delayed by a delay time,
wherein in response to the input signal being at a first potential, the first transistor is turned off, the first switching circuit is turned on, and a voltage of the output node starts to decrease from a voltage reference point,
wherein in response to at least one of a manufacturing process, the first reference voltage, and a temperature being changed, the compensation resistor is configured to correct the voltage reference point.

2. The delay circuit according to claim 1, wherein the first transistor is a P-type metal oxide semiconductor (MOS) field effect transistor.

3. The delay circuit according to claim 1, wherein the first potential is a high potential.

4. The delay circuit according to claim 1, wherein the first switching circuit includes an N-type metal oxide semiconductor (MOS) field effect transistor.

5. The delay circuit according to claim 1, further comprising:
a second current source connected between the first reference voltage and the second reference voltage; and
a second transistor having a first terminal connected to the current source, a second terminal connected to the first terminal of the second transistor, and a third terminal connected to the second reference voltage;
wherein the first current source includes a third transistor having a first terminal connected to the first node, a second terminal connected to the second terminal of the second transistor, and a third terminal connected to the second reference voltage, and wherein the second transistor and the third transistor form a first current mirror circuit.

6. The delay circuit according to claim 5, wherein the second transistor and the third transistor are N-type MOS transistors.

7. The delay circuit according to claim 5, further comprising:
a second inverter having an input terminal receiving the input signal; and
a third inverter having an input terminal connected to the second inverter and an output terminal connected to the second terminal of the first transistor.

8. The delay circuit according to claim 6, further comprising:
a fourth transistor having a first terminal connected to the first reference voltage, and a second terminal connected to the second terminal of the first transistor and the output terminal of the third inverter,
wherein the first switch circuit includes:
a transmission gate having a first terminal connected to the output node, a second terminal connected to the third terminal of the fourth transistor and the second reference voltage, a first control terminal connected to the output terminal of the third inverter, and a second control terminal connected to an output terminal of the second inverter.

9. The delay circuit according to claim 6, wherein the fourth transistor is a P-type MOS transistor.

10. The delay circuit according to claim 8, wherein the first switching circuit further includes a fifth transistor having a first terminal connected to the second terminal of the transmission gate and the third terminal of the fourth transistor, a second terminal connected to the second terminal of the second transistor, and a third terminal connected to the second reference voltage,
wherein the second transistor and the fifth transistor form a second current mirror circuit.

11. The delay circuit according to claim 10, wherein the transmission gate is turned on in response to the input signal being at the first potential, and the transmission gate is turned off in response to the input signal being at a second potential.

12. The delay circuit according to claim 10, wherein the fifth transistor is an N-type MOS transistor.

* * * * *